(12) United States Patent
Kraemer et al.

(10) Patent No.: US 11,522,547 B1
(45) Date of Patent: Dec. 6, 2022

(54) BIAS UNIT ELEMENT WITH BINARY WEIGHTED CHARGE TRANSFER CAPACITORS

(71) Applicant: Redpine Signals, Inc., San Jose, CA (US)

(72) Inventors: Martin Kraemer, Mountain View, CA (US); Ryan Boesch, Louisville, CO (US); Wei Xiong, Mountain View, CA (US)

(73) Assignee: Ceremorphic, Inc., San Jose, CA (US)

( * ) Notice: Subject to any disclaimer, the term of this patent is extended or adjusted under 35 U.S.C. 154(b) by 0 days.

(21) Appl. No.: 17/334,817

(22) Filed: May 31, 2021

(51) Int. Cl.
*G06F 7/544* (2006.01)
*H03K 19/20* (2006.01)
*H03M 1/12* (2006.01)
*G06F 7/50* (2006.01)
*G06F 7/523* (2006.01)

(52) U.S. Cl.
CPC .............. *H03K 19/20* (2013.01); *G06F 7/50* (2013.01); *G06F 7/523* (2013.01); *G06F 7/5443* (2013.01); *H03M 1/12* (2013.01)

(58) Field of Classification Search
CPC .......... G06F 7/50; G06F 7/523; G06F 7/5443; H03K 19/20; H03M 1/12
See application file for complete search history.

(56) References Cited

U.S. PATENT DOCUMENTS

| | | | |
|---|---|---|---|
| 9,083,375 B1* | 7/2015 | Chang | H03M 1/125 |
| 9,425,814 B1* | 8/2016 | Verma | H03M 7/165 |
| 10,592,209 B1* | 3/2020 | Paulsen | H03G 3/001 |
| 10,886,933 B1* | 1/2021 | Ghosh | H03M 1/164 |
| 2013/0308028 A1* | 11/2013 | Bahukhandi | H03M 1/12 341/172 |
| 2014/0035772 A1* | 2/2014 | Tsai | H03M 1/12 341/172 |
| 2015/0295587 A1* | 10/2015 | Garcia Gonzalez | H03M 1/1019 341/120 |
| 2020/0204190 A1* | 6/2020 | Rattan | H03M 1/38 |
| 2020/0366308 A1* | 11/2020 | Nicolas | H01G 4/40 |
| 2022/0066740 A1* | 3/2022 | Radhadevi | G06F 17/16 |
| 2022/0075596 A1* | 3/2022 | Agrawal | G06F 7/5443 |
| 2022/0209788 A1* | 6/2022 | Kraemer | G06F 7/5443 |

\* cited by examiner

*Primary Examiner* — Kurtis R Bahr
(74) *Attorney, Agent, or Firm* — File-EE-Patents.com; Jay A. Chesavage

(57) ABSTRACT

A Bias Unit Element (UE) has a digital input and sign input, and comprises a positive Bias UE and a negative Bias UE, each comprising groups of NAND gates generating an output and a complementary output, each of which are coupled to differential charge transfer lines through binary weighted charge transfer capacitors to a differential charge transfer bus comprising a positive charge transfer line and a negative charge transfer line. The sign input enables the positive Bias UE when the sign bit is positive and enables the negative Bias UE when the sign bit is negative.

21 Claims, 15 Drawing Sheets

Multiplication of two three bit binary numbers

R=A*B=[a2 a1 a0] * [b2 b1 b0]:

a0 * [0  0  b2 b1 b0]
a1 * [0  b2 b1 b0]
a2 * [b2 b1 b0]

$$R = [\underbrace{0}_{p5} \quad \underbrace{a2b2}_{p4} \quad \underbrace{a1b2+a2b1}_{p3} \quad \underbrace{a0b2+a1b1+a2b0}_{p2} \quad \underbrace{a0b1+a1b0}_{p1} \quad \underbrace{a0b0}_{p0}]$$

$$R = 2^5 *p5 + 2^4 *p4 + 2^3 *p3 + 2^2 *p2 + 2^1 *p1 + 2^0 *p0$$

Scaleable Unit Element-based MAC, Bias, ADC

Unit Element—Negative

Unit Element-Positive

BIAS UE-Negative

BIAS UE-Positive

SAR ADC Block Diagram using Bias UE

SAR Logic and Control with Relu

SAR Logic and Control with Relu

SAR Controller Waveforms

Scaleable Unit Element-based MAC, Bias, ADC

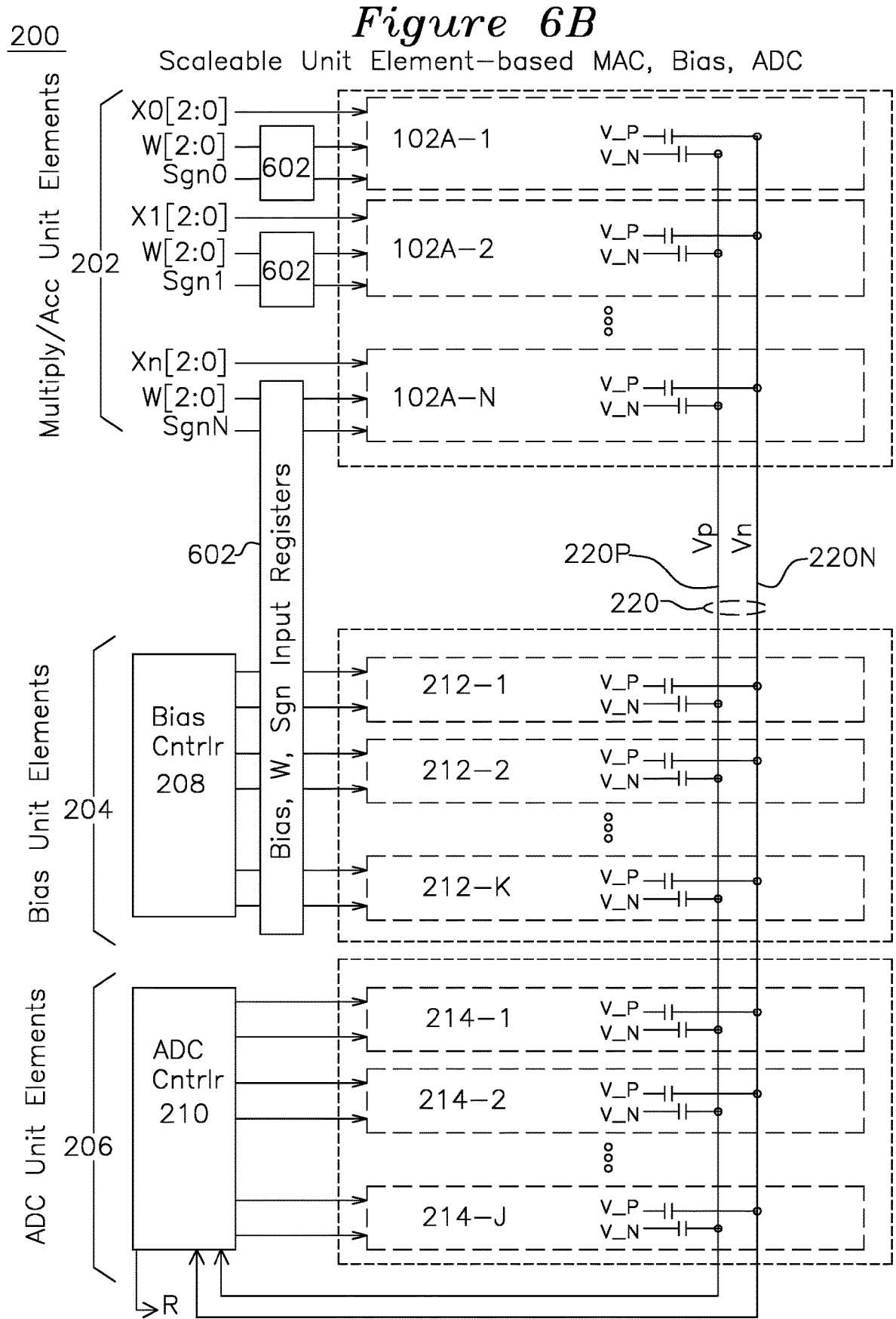

3 Layer Digital ML Architecture

3 Layer Analog ML Architecture using 3x3x64 AMACs

US 11,522,547 B1

BIAS UNIT ELEMENT WITH BINARY WEIGHTED CHARGE TRANSFER CAPACITORS

FIELD OF THE INVENTION

The present invention relates to a multiplier-accumulator (MAC). In particular, the invention relates to an architecture for a scalable asynchronous multiplier-accumulator with unit element (UE) stages that can be cascaded and configured to operate as MAC UEs, Bias UEs, and analog to digital converter (ADC) UEs. The MAC accepts digital activation X inputs and associated kernel W inputs and generates an accumulated dot product output as a digital value representing a sum of multiplication products.

BACKGROUND OF THE INVENTION

The expanded use of Artificial Intelligence (AI) software applications has created a need for scalable hardware multiplier-accumulators for acceleration of software algorithms used in machine learning (ML). An nxn multiplier increases in gate complexity as $n^2$, and large numbers of adders are further needed for multiply-accumulate operations. Additionally, prior art multipliers relied on synchronous, clocked stages to operate, and the clocked operation results in increased power dissipation.

For example, in machine learning applications, it is often desired to form dot products in the form of multiply-accumulate operations between a 1xn input row vector X (referred to as an activation input)and a nxm W weighting coefficient matrix also referred to as a kernel to generate a nx1 column matrix result R, such as:

$$[X_1 \; X_2 \; \ldots \; X_n] \cdot \begin{bmatrix} W_{11} & \ldots & W_{1m} \\ \vdots & \ddots & \vdots \\ W_{n1} & \ldots & W_{nm} \end{bmatrix} = \quad \text{(Equation 1)}$$

$$\begin{bmatrix} R_1 \\ \vdots \\ R_n \end{bmatrix}^T = \begin{bmatrix} X_1 W_{11} + X_2 W_{21} + \ldots + X_n W_{n1} \\ X_1 W_{12} + X_2 W_{22} + \ldots + X_n W_{n2} \\ \vdots \\ X_1 W_{1m} + X_2 W_{2m} + \ldots + X_n W_{nm} \end{bmatrix}^T$$

It is desired to provide an architecture for a multiplier and multiplier-accumulator which operates asynchronously and minimizes power consumption from displacement currents in the multiplier accumulator internal circuitry. This power savings can be realized by an architecture which minimizes displacement currents when the kernel (coefficient matrix W) is mostly static as is commonly the case in ML applications. It is further desired to provide a common unit element structure for the various MAC processing steps, including a bias input and Analog to Digital Converter. It is further desired to provide an architecture for a MAC, Bias and ADC using a common unit element structure coupled to a pair of differential charge transfer lines of a differential charge transfer bus.

OBJECTS OF THE INVENTION

A first object of the invention is an architecture for a multiply-accumulate (MAC) having a first plurality of MAC unit elements (MAC UEs) performing multiply-accumulate operations on X and W digital inputs, each MAC UE providing a result as a charge transferred to differential charge transfer lines, a second plurality of Bias unit elements (Bias UEs) performing a bias operation and placing a bias value as a charge onto the differential charge transfer lines, and a third plurality of ADC unit elements (ADC UEs) operative to convert a charge present on the differential charge transfer lines into a digital output value.

A second object of the invention is a MAC unit element (MAC UE) operative to transfer charge values from multiplication results of a digital X input with a digital W input and transferring the multiplication result as a charge representing each multiplication result onto shared differential charge transfer lines comprising a shared positive charge transfer line and a shared negative charge transfer line, the MAC UE comprising a plurality of NAND-groups, each NAND-group comprising a plurality of NAND gates, each NAND gate of each NAND-group receiving one of the W input bits and each of the X input bits, each NAND gate having a positive output coupled through a binary weighted positive charge transfer capacitor to a positive charge transfer line and a negative output coupled through a binary weighted negative charge transfer capacitor to a negative charge transfer line.

A third object of the invention is a MAC unit element (MAC UE) accepting an X digital input and a W digital input accompanied by a Sign bit input, the MAC UE comprising a positive unit element and a negative unit element, the MAC unit element operative to transfer a binary weighted charge corresponding to a multiplication result of the digital X input with the digital W input and sign bit, the binary weighted charge being transferred as a differential charge onto a differential charge transfer bus comprising a positive charge transfer line and a negative charge transfer line, each binary W and X multiplication term coupled to a charge transfer capacitor having an associated binary weight according to X and W bits being multiplied;

the positive unit element enabled when the sign bit is positive, the positive unit element comprising a plurality of NAND-groups, each NAND-group comprising a plurality of NAND gates, each NAND gate of a NAND-group receiving one of the W input bits and each of the X input bits, each NAND gate having a positive output coupled through a binary weighted positive charge transfer capacitor to the positive charge transfer line and a negative output coupled through a binary weighted negative charge transfer capacitor to the negative charge transfer line;

the negative unit element enabled when the sign bit is negative, the negative unit element comprising a plurality of NAND-groups, each NAND-group comprising a plurality of NAND gates, each NAND gate receiving one of the W input bits and each of the X input bits, each NAND gate having a positive output coupled through a binary weighted positive charge transfer capacitor to the negative charge transfer line and a negative output coupled through a binary weighted negative charge transfer capacitor to the positive charge transfer line.

A fourth object of the invention is a Bias unit element (UE) receiving a sign bit and a digital E input, the Bias unit element comprising a positive Bias UE enabled when the sign bit is positive (logic 0) and a negative Bias UE enabled when the sign bit is negative (logic 1), the positive Bias UE and negative Bias UE coupled to a positive charge transfer line and negative charge transfer line;

each bit of the positive Bias UE transferring a binary weighted positive charge to the positive charge transfer line and transferring a binary weighted negative charge to the negative charge transfer line when a false to true transition occurs, and transferring a binary weighted positive charge to the negative charge transfer line and transferring a binary weighted negative charge to the positive charge transfer line when a true to false transition occurs;

each bit of the negative Bias UE transferring a binary weighted charge to a respective negative charge transfer line when a false to true transition occurs or to a respective positive charge transfer line when a true to false transition occurs.

A fifth object of the invention is an analog to digital converter (ADC) for converting charge coupled to a differential charge transfer bus comprising a positive charge line and a negative charge line to a result, the ADC comprising:

a shared differential charge transfer bus, the differential charge transfer bus having a positive charge transfer line and a negative charge transfer line;

a plurality of groups of ADC unit elements (UE) coupled to the differential charge transfer bus, each group of ADC UE comprising a plurality of ADC UE, the number of ADC UE in each group being a factor of two greater than a number of UE in a previous ADC UE group, each ADC UE group having an E input determining an amount of charge to be transferred when the associated ADC UE group is enabled;

a Successive Approximation Register (SAR) controller coupled to the positive charge transfer line and the negative charge transfer line, the SAR controller comprising:

a comparator coupled to the positive charge transfer line and negative charge transfer line, the comparator configured to assert an output when a positive charge transfer line voltage exceeds a negative charge output voltage;

the controller enabling and disabling groups of ADC UE in a successive approximation sequence according to the comparator output value, with each successive decision to enable a successive group of ADC UE determined by the comparator output, the sequence of comparator output values being components of a digital value corresponding to a charge being converted to a binary output value.

A sixth object of the invention is a chopper stabilized MAC unit element (MAC UE) accepting an X digital input and a W digital input accompanied by a sign bit input, the MAC UE comprising a positive unit element and a negative unit element, the MAC unit element operative to commutate the sign bit and forming a chopped sign bit at a chop rate, the MAC unit element transferring a charge corresponding to a multiplication result of the digital X input with the digital W input and sign bit, the differential charge transferred onto a differential charge transfer bus comprising a positive charge transfer line and a negative charge transfer line;

the positive unit element enabled when the chopped sign bit is positive, the positive unit element comprising a plurality of NAND-groups, each NAND-group comprising a plurality of NAND gates, each NAND gate of a NAND-group receiving one of the W input bits and each of the X input bits, each NAND gate having a positive output coupled through a binary weighted positive charge transfer capacitor to a positive charge transfer line and a negative output coupled through a binary weighted negative charge transfer capacitor to a negative charge transfer line;

the negative unit element enabled when the sign bit is negative, the negative unit element comprising a plurality of NAND-groups, each NAND-group comprising a plurality of NAND gates, each NAND gate receiving one of the W input bits and each of the X input bits, each NAND gate having a positive output coupled through a binary weighted positive charge transfer capacitor to a negative charge transfer line and a negative output coupled through a binary weighted negative charge transfer capacitor to a positive charge transfer line;

the MAC UE providing a first result during a first chopped sign bit interval and providing a second result during a second interval of a chopped sign bit interval for use in determining a result by an ADC coupled to the positive charge transfer line and negative charge transfer line.

SUMMARY OF THE INVENTION

A unified architecture for a multiplier accumulator has a charge transfer bus which is common to a plurality of multiplier-accumulator unit elements (MAC UE), a plurality of Bias Unit Elements (Bias UE), and a plurality of Analog to Digital Converter Unit Elements (ADC UE), the ADC UEs coupled to a successive approximation register (SAR) controller. The MAC UEs, Bias UEs, and ADC UEs interconnected with a common charge transfer bus comprising a positive charge transfer line and a negative charge transfer line. The MAC UEs and Bias UEs each generate offsetting complementary charges to the respective positive and negative charge transfer lines, such that when a charge is added to or subtracted from the positive charge transfer line, an equal charge is respectively subtracted or added to the negative charge transfer line. This balance in charge displacement eliminates common mode imbalances when later converting the charges on the bus into a voltage.

The positive charge transfer line and negative charge transfer line receive a binary weighted charge according to a bit weight of an X input comprising bits [x2,x1,x0] multiplied by a kernel W comprising bits [w2,w1,w0] and applying a sign bit. The positive and negative charge transfer line are configured such that bit 0 of the X input (x0) multiplied by bits 0, 1, and 2 of a W input transfers a binary weighted charge to the charge transfer lines with respective binary weights 1, 2, and 4. Bit 1 of the X input (x1) multiplied by bits 0, 1, and 2 of the W input transfers a binary weighted charge to the charge transfer lines with respective binary weights 2, 4, and 8. Bit 2 of the X input (x2) multiplied by bits 0, 1, and 2 of the W input transfer a binary weighted charge to the charge transfer lines with respective binary weights 4, 8, and 16. In this manner, the multiplication of a three bit X value with a three bit W value transfers binary weighted charge to the charge transfer lines with ascending charge weights 1, 2, 4, 2, 4, 8, 4, 8, 16, respectively.

The plurality of MAC UEs each accept a unique X activation input and a corresponding W kernel input which is different for each new column multiply-accumulate, each MAC UE generating differential charge displacements onto the positive and negative line of the shared differential charge transfer bus according to a positive to negative transition or a negative to positive transition applied to the binary weighted charge transfer capacitors coupled to a charge transfer line. Each MAC UE has a positive UE part and a negative UE part, the positive UE part is enabled when the sign is positive and the negative UE part is enabled when the sign is negative.

The Bias UEs have a very similar UE architecture as the MAC UE comprising a positive UE component and a negative UE component, each positive UE component and negative UE component having outputs and complementary outputs coupled through binary weighted charge transfer capacitors to the shared differential charge transfer bus. The Bias UEs add a bias charge from a respective E[5:0] input to the accumulated result as may be required for machine learning activation.

The ADC coupled to the charge transfer bus comprises a binary weighted sequence of groups of ADC UEs which are enabled and controlled as binary weighted groups of ADC UEs by an SAR controller to transfer charge in and out of the shared differential charge transfer bus to successively estimate the charge value stored in the MAC UEs and Bias UEs. The successive approximation approach also provides for a programmable accuracy, since the digitized output is a bit sequence which starts with the most significant bit, and the programmable accuracy may provide additional reduction in power consumption by stopping the conversion early when needed. The ADC optionally accepts a Rectified Linear Unit (ReLU) input, which may be used to perform a ReLU activation function by terminating the ADC conversion and outputting 0 for negative results that are detected early in conversion, thereby additionally reducing power consumption by early termination of the ADC conversion process upon detection of a net negative charge value on the charge transfer bus.

In a variation of the invention for reducing 1/f noise and offsets associated with gain or charge imbalances between the positive and negative MAC UE as well as offsets in the ADC UE and ADC comparator, in a first embodiment of the variation, the sign bit is exclusive-ORed with a square wave first chop clock at a chop rate equal to twice the data multiplication rate to form a chopped sign bit applied to each MAC UE and Bias UE coupled to the positive and negative charge transfer line. During a first half cycle of the chop clock cycle, the ADC UE generates a first result $V_{result1}+V_{offset}$, and during a second half of the chop clock cycle, the ADC UE generates (an inverted) second result $-V_{result2}+V_{offset}$. By subtracting the second result from the first and dividing by 2, the $V_{offset}$ components cancel and $$\frac{Vresul1 + Vresul2}{2}$$

remains, thereby averaging any gain difference between the positive MAC UE and negative MAC UE contributing to any difference between $V_{result1}$ and $V_{result2}$. This first variation of the invention results in the positive charge and negative charge operating as before, but reversing magnitude with each multiplication to cancel offsets and average gain differences between the positive MAC UE and negative MAC UE (as well as the positive and negative Bias UE). In an example of this first embodiment variation of the invention, the first result is converted by the ADC UE at the end of the first half of the chop clock, and the second result is converted by the ADC UE at the end of the second half of the chop clock and the second result is subtracted from the first result using digital circuitry. In a second embodiment of this variation of the invention, the MAC UE and Bias UE operate in a conventional manner, without the first chop clock modifying the sign bit, but the input to the comparator of the ADC UE controller is commutated at a second chop clock rate, so that each conversion of charge on the charge transfer bus generates a first digital value, and then a second digital value which is opposite the first digital value. Similarly, but subtracting the second digital value from the first, offsets originating from the ADC comparator are cancelled.

BRIEF DESCRIPTION OF THE DRAWINGS

FIG. 6B shows a MAC of FIG. 2 with a sequence of registered weight and sign input values.

FIGS. 7B-1, 7B-2, 7B-3, 7B-4 show plots for the level 3 AMACs of FIG. 7D operating concurrently over different segments of the data in FIG. 7A.

DETAILED DESCRIPTION OF THE INVENTION

Figures 1A, 1B, 1C:
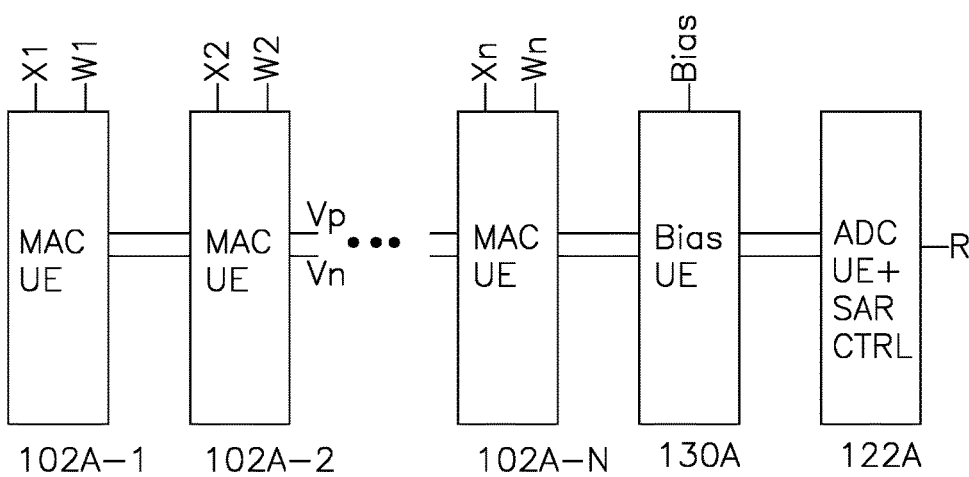
FIG. 1A shows an example multiplication of two 3 bit multiplicands.
FIG. 1B shows an expansion of the multiplication of FIG. 1A identifying individual terms.
FIG. 1C shows a block diagram for an accumulating multiplier performing dot product operations.

By way of convention, in the present application, similar reference numbers on different figures indicate the same element or function. Where a function is performed by individual elements, the suffixes a, b, c, A, B, C, 1, 2, 3, etc., may be appended as appears in the drawings, whereas the elements taken as a whole are understood to be without suffix, so for example unit element 102 is understood to refer to any such structure when a suffix a, b, c, A, B, C, or -1, -2, -3, etc. is not present.

FIGS. 1A and 1B show an example expansion for multiplication of two 3 bit binary numbers. This may also be described as the partial product expansion:

p0[2:0]={a[0]&b[2], a[0]&b[1], a[0]&b[0]}
p1[2:0]={a[1]&b[2], a[1]&b[1], a[1]&b[0]}
p2[2:0]={a[2]&b[2], a[2]&b[1], a[2]&b[0]}
which can be rearranged as a weighted charge transfer bus where W=x indicates the weight of the charge transfer line:
R[W=1]=1*p0[0]
R[W=2]=2*p0[1]
R[W=4]=4*p0[2]
R[W=2]=2*p1[0])
R[W=4]=4*p1[1]

R[W=8]=8*p1[2]
R[W=4]=4*p2[0]
R[W=8]=8*p2[1]
R[W=16]=16*p2[2]

In one example embodiment, the binary charge summing may be performed by selection of relative capacitor values in the charge summing unit to provide the indicated weights during summing.

Figure 1D:
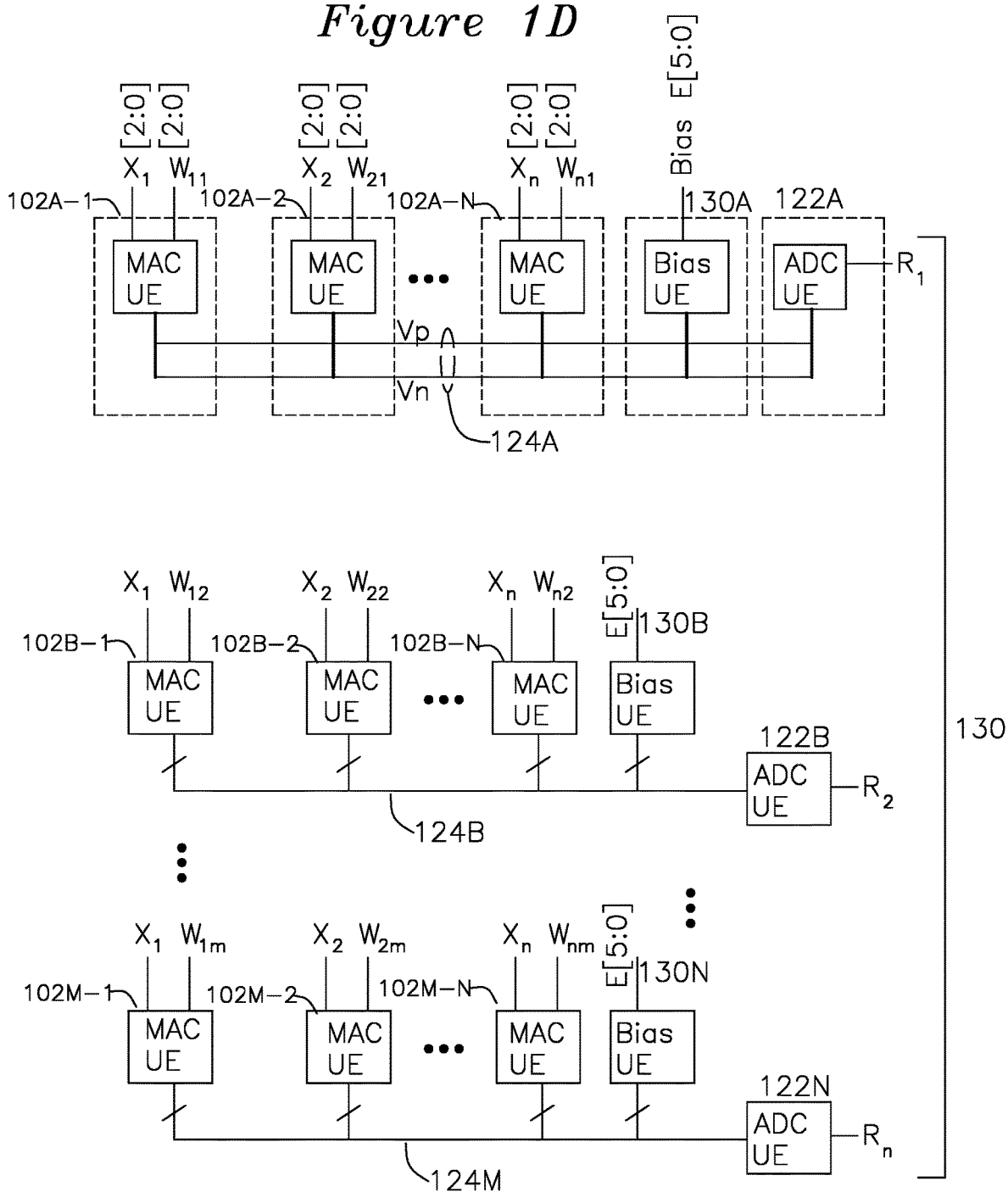
FIG. 1D shows a block diagram of 2D MAC operation including charge summing and ADC.

FIG. 1C shows a single row computation and FIG. 1D shows a block diagram example for a complete dot product for implementing the dot product:

$$[X_1 \; X_2 \; \ldots \; X_n] \cdot \begin{bmatrix} W_{11} & \ldots & W_{1m} \\ \vdots & \ddots & \vdots \\ W_{n1} & \ldots & W_{nm} \end{bmatrix} =$$

$$\begin{bmatrix} R_1 \\ \vdots \\ R_n \end{bmatrix}^T = \begin{bmatrix} X_1 W_{11} + X_2 W_{21} + \ldots + X_n W_{n1} \\ X_1 W_{12} + X_2 W_{22} + \ldots + X_n W_{n2} \\ \vdots \\ X_1 W_{1m} + X_2 W_{2m} + \ldots + X_n W_{nm} \end{bmatrix}^T$$

MAC Unit Elements (UE) 102A-1 through 102A-N perform the MAC computation for element R1 of the dot product, MAC UE 102B-1 through 102B-N perform the computation for element R2 of the dot product, and MAC UE 102M-1 through 102M-N perform the MAC computation for element Rn. Accordingly, the architecture of the present invention provides for any number of UEs to be arranged in rows and columns as shown to provide an expandable dot matrix computation for an arbitrary size of the X activation matrix and W kernel matrix. Additionally, the architecture provides flexibility in being reconfigured for a larger or smaller number of X and W matrices.

Figure 2:
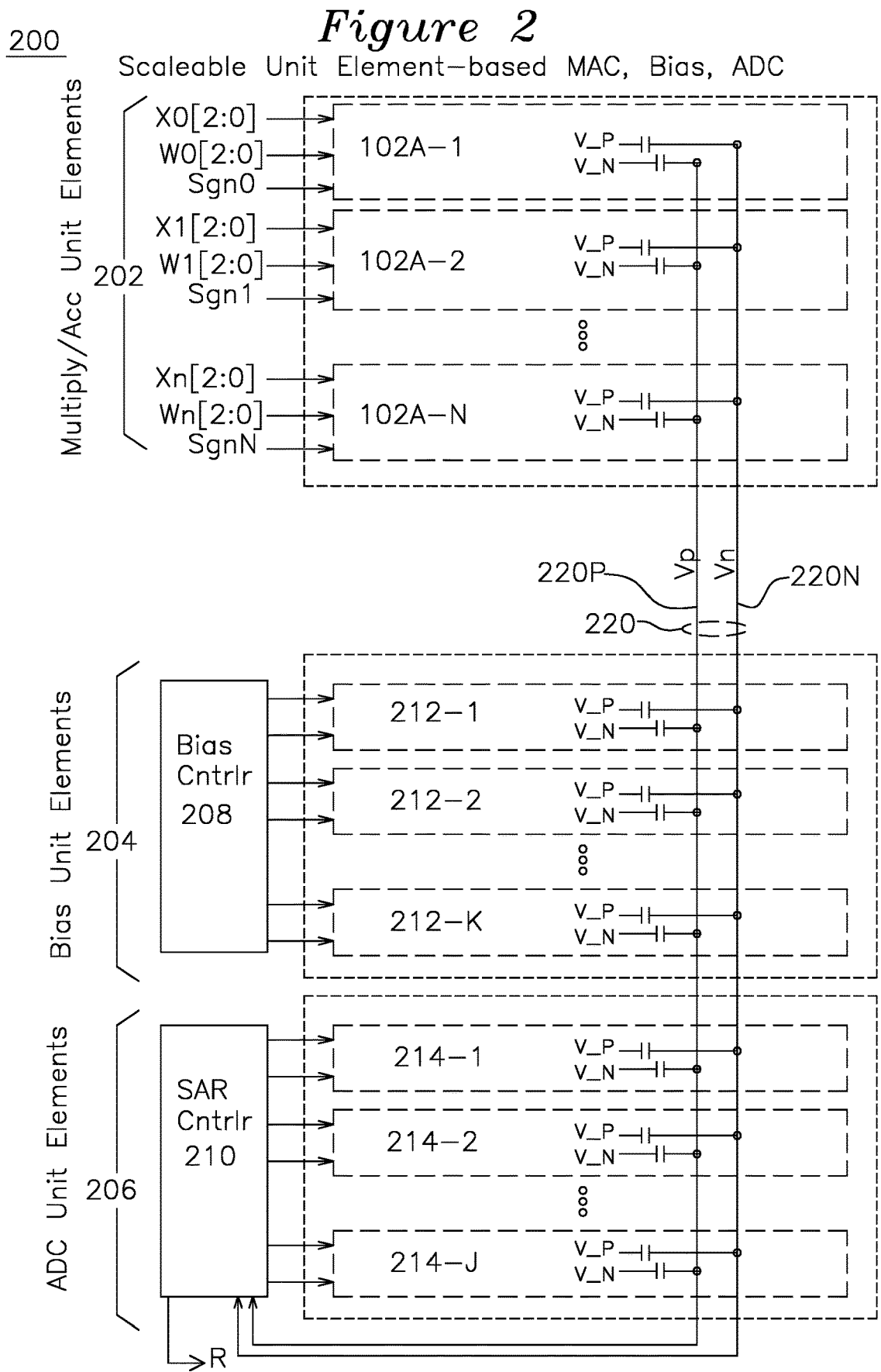
FIG. 2 shows a block diagram of a MAC architecture with a plurality of MAC UEs, a plurality of Bias UEs, and a plurality of ADC UEs sharing a common charge transfer bus.

FIG. 2 shows a block diagram of an overall architecture for the multiplier-accumulator with example MAC UEs 202 comprising 102A-1 to 102A-n of FIG. 1C and 1D, BIAS UEs 204 comprising 212-1 to 212-K, and ADC UEs 206 comprising ADC UE groups 214-1 through 214-J. A shared differential charge transfer bus 220 includes a charge transfer line Vp 220P and a charge transfer line Vn 220N which are common to the MAC UEs 202, Bias UEs 204, and ADC UEs 206. Each MAC UE in the present example receives a three bit X input [x2, x1, x0] and a three bit W input [w2, w1, w0] accompanied by a sign bit SGN. The W input and X inputs are integers of range 0-7 and the sign bit is a binary value indicating a positive or negative value which may be associated with the W input. Each MAC unit element has an AND or NAND gate operating in a unique combination of digital X input and digital W input, each AND or NAND gate generating complementary charge transfer outputs, one of which is coupled through a binary weighted positive charge transfer capacitor to a respective positive charge transfer line and the other through a binary weighted negative charge transfer capacitor to a respective negative charge transfer line. The charge transfer capacitors of each MAC are of binary weighted capacitance values C, 2C, 4C, 8C, 16C with each multiplication result applied to the differential charge transfer line.

Bias UE 204 comprises a plurality K of Bias UEs 212-1 to 212-K which receive a bias input that may be used to provide a signed offset charge value to the charge transfer bus. The bias UE has a similar differential charge transfer bus architecture as the MAC UE 202, where each bias input provides complementary binary weighted charges to the positive and negative charge transfer lines 220P and 220N, respectively, using binary weighted charge transfer capacitors.

ADC UE 206 comprises a plurality of UE groups 214-1 through 214-J for conversion of the charges transferred to the positive and negative charge transfer lines 220P to 220N into a digital output value which represents an associated MAC output R value for the overall MAC and Bias operations of each MAC UE and Bias UE of 202 and 204, respectively.

Figure 3A:
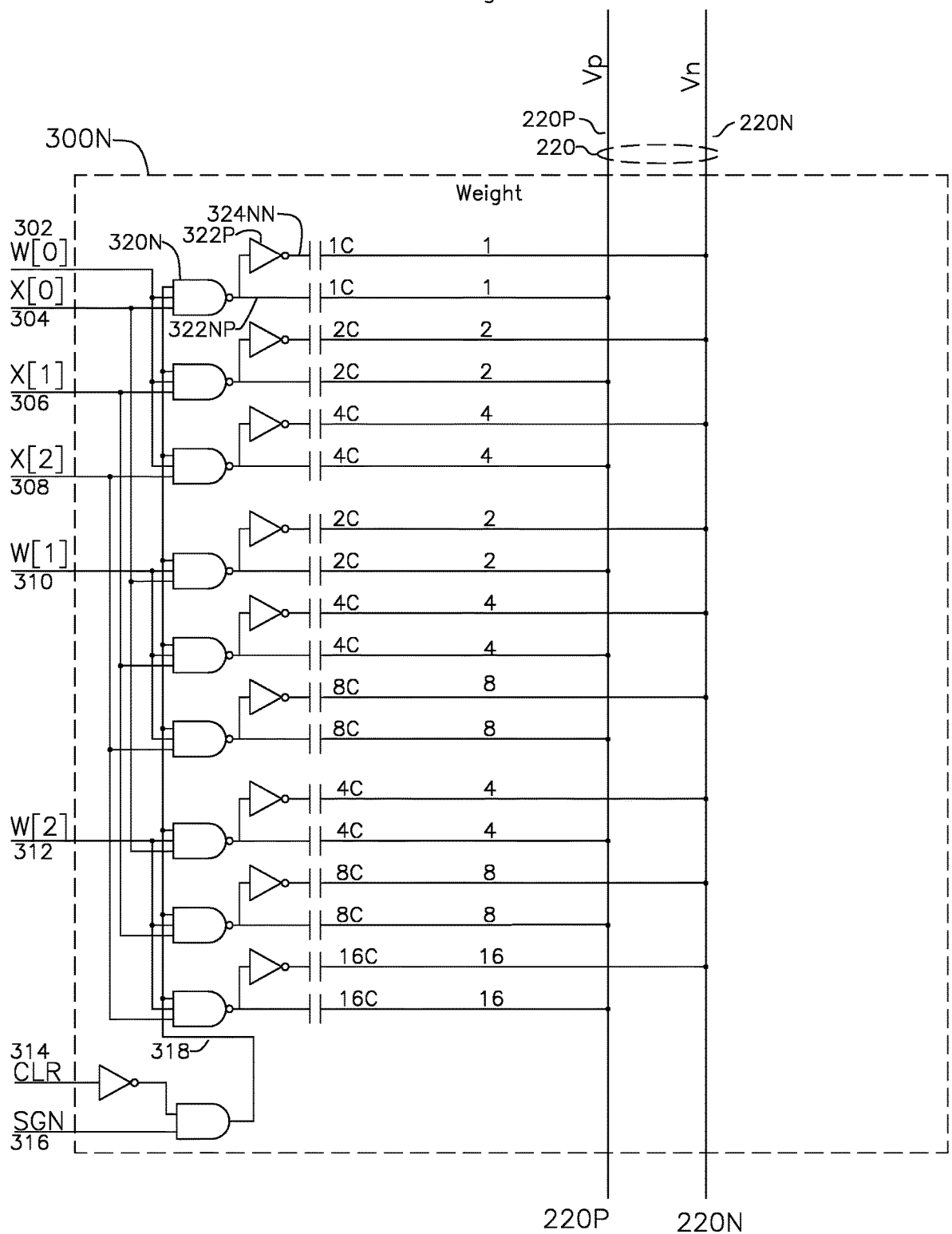
FIGS. 3A and 3B show a schematic diagram of a negative MAC Unit Element and positive MAC Unit Element, respectively.
Figure 3B:
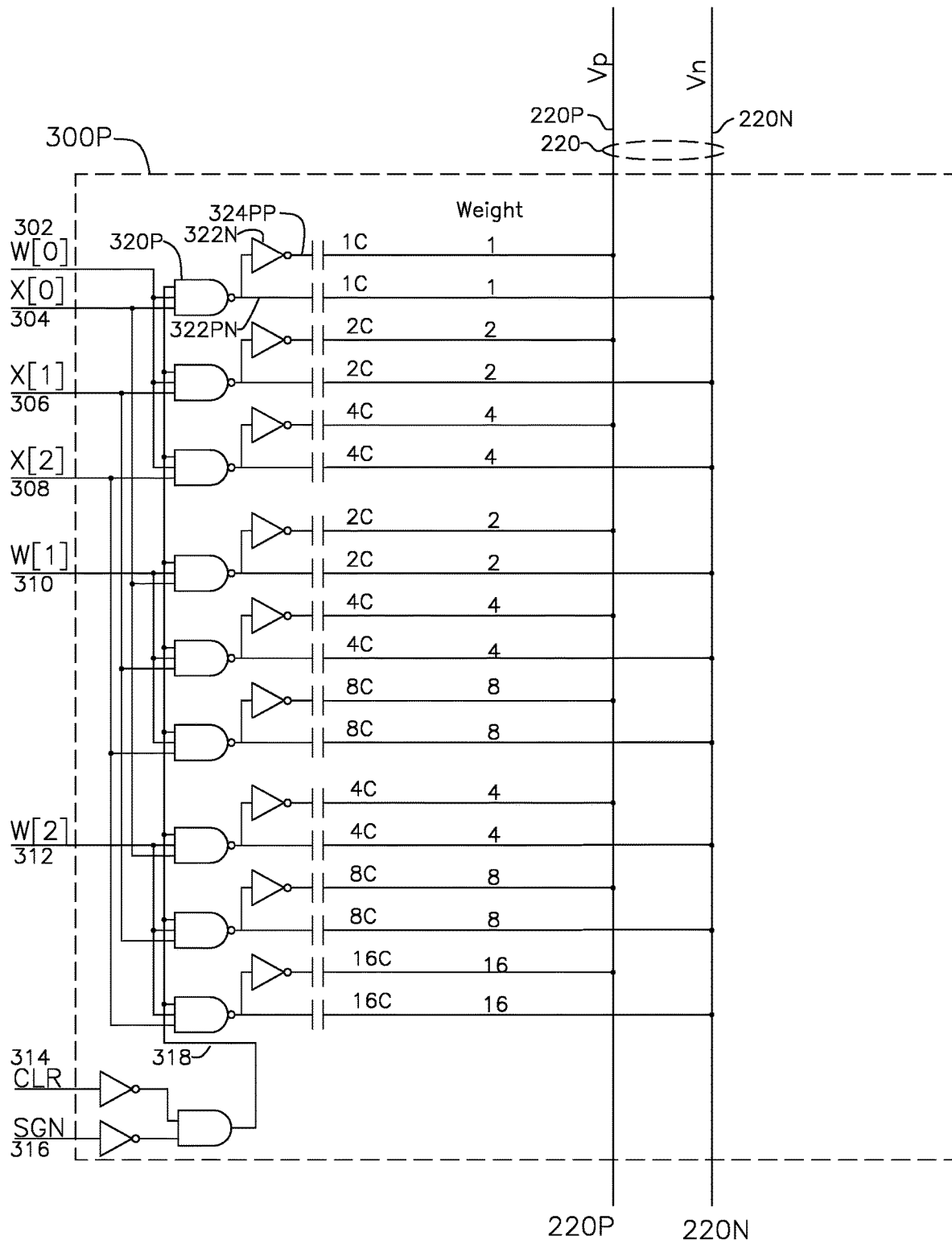

FIGS. 3A and 3B show a schematic diagram for the unit elements 300N and 300P, respectively, corresponding to any of the 102 prefix UEs of FIGS. 1C, 1D, or 2. Shared positive charge transfer line 220P and shared negative charge transfer line 220N are common to each MAC UE such as 102 shown as positive and negative MAC UE 300P and 300N, respectively. The MAC UE 300P and 300N receives the X input X[0], X[1], and X[2] along with W inputs W[0], W[1], and W[2], which are distributed to NAND gates having a complementary output such as 320P with output 320PP and complementary output 324PN. Each NAND gate generates a product output and product complementary output and has an associated binary weighted charge transfer capacitor as was described in FIG. 1B, where W[0] multiplied by X[0], X[1], X[2] generates an output coupled to associated charge transfer capacitors with relative binary weightings 1C, 2C, 4C. A set of NAND or AND gates which generate a particular W bit weight are referred to as a NAND-group, the number of NAND-groups equal to the number of W bits and the number of NAND gates in a NAND-group equal to the number of X bits. The NAND-group architecture has the advantage of minimizing the number of gate which have outputs changing state and transferring charge for static W values. The NAND-group which multiplies W[1] with by X[0], X[1], X[2] generates complementary outputs with respective charge transfer capacitance values 2C, 4C, and 8C, and the NAND-group which multiplies W[2] by X[0], X[1], X[2] generates complementary outputs with respective charge transfer capacitance values 4C, 8C, and 16C. Accordingly, for a MAC UE multiplying three bits of X with three bits of W, 9 charge transfer capacitors may be used, each charge transfer capacitor having a positive and negative component and coupled to the output and complementary output of a corresponding NAND gate. The MAC UE 300P of FIG. 3B is enabled when SGN 316 is positive (input=0) and MAC UE 300N of FIG. 3A is enabled when SGN 316 is negative (input=1), and whichever UE is enabled, the multiplication result is transferred as complementary positive and negative charges to the respective positive and negative charge transfer line. Charge is added to a charge transfer line through a respective charge transfer capacitor coupled to the output of a NAND gate or inverter when a gate transitions from low to high, and charge is removed from a respective charge transfer line when the gate transitions from high to low. The differential nature of the offsetting transitions of FIGS. 3A and 3B provide reduced susceptibility to common mode offset errors which would occur for single ended charge transfers for a UE with only a positive (or single-ended) charge transfer bus.

Figure 4A:
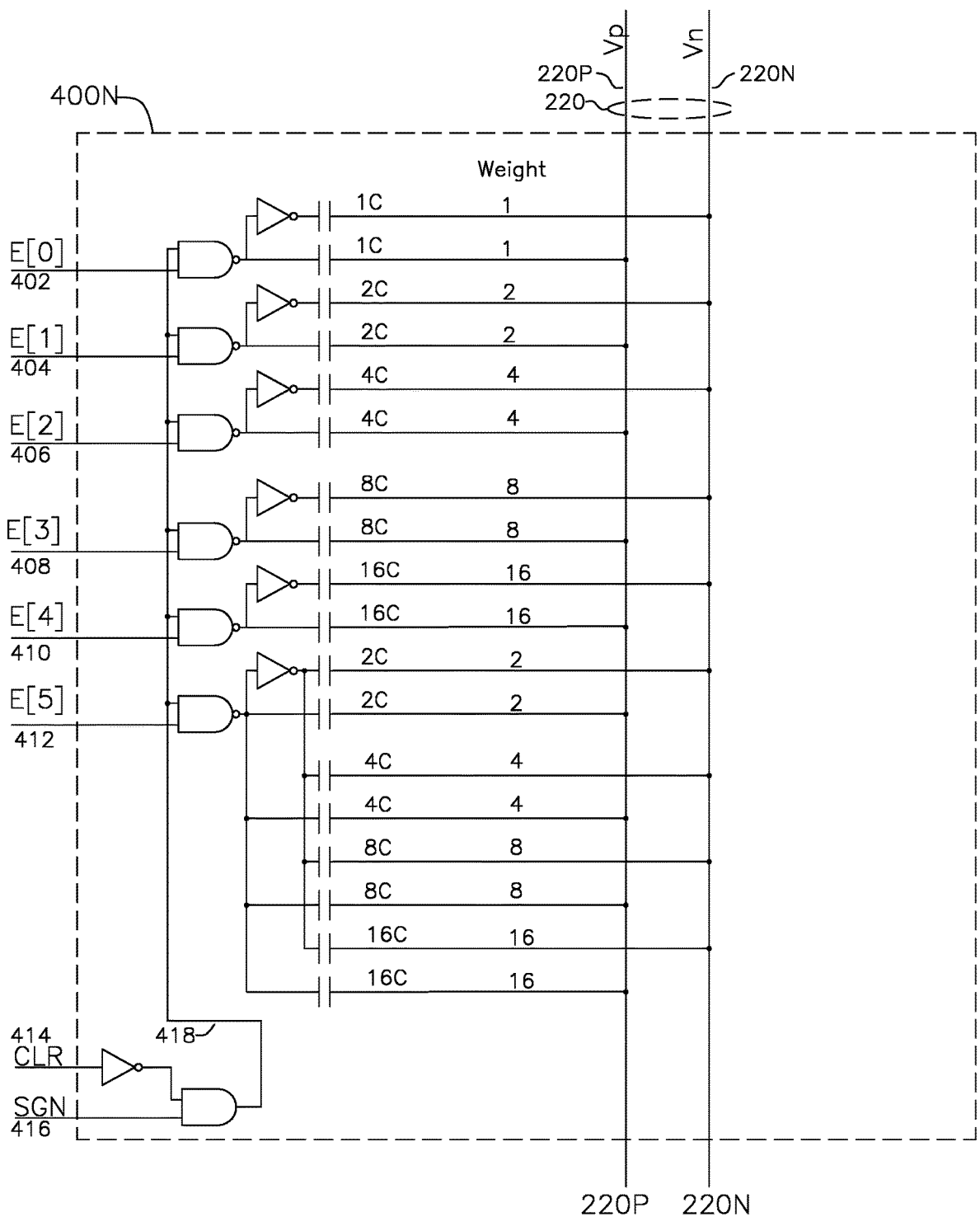
FIGS. 4A and 4B show a schematic diagram of a negative Bias Unit Element and positive Bias Unit Element, respectively.
Figure 4B:
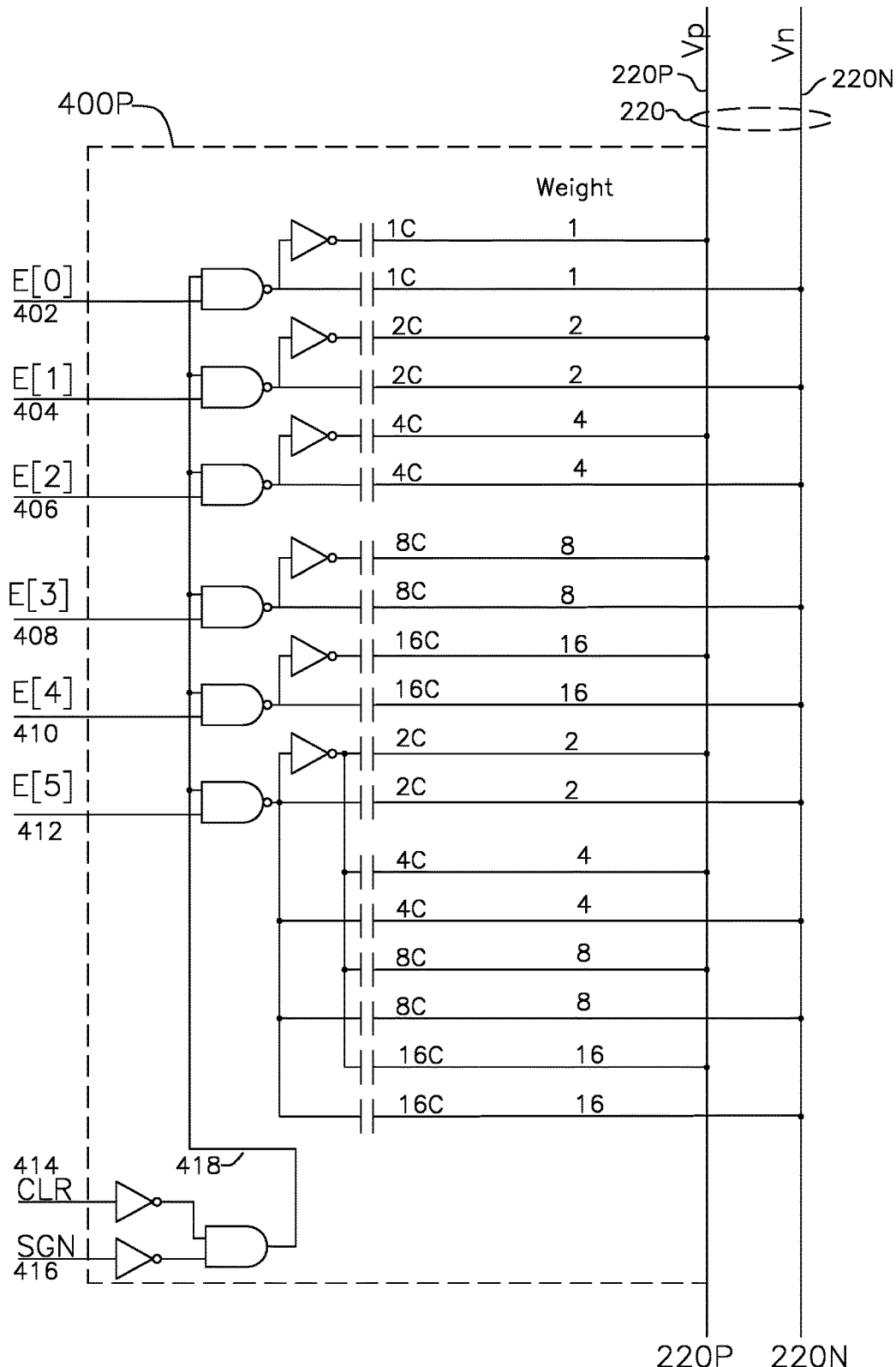

FIGS. 4A and 4B show an example Bias UE in one example of the invention, comprising a positive bias UE part 400P of FIG. 4B and negative bias UE part 400N shown in FIG. 4A. Each bias UE part is operative to provide a complementary bias to a particular binary weighted charge transfer capacitor, as can be seen from the Bias UE charge transfer capacitor relative binary weightings 1C, 2C, 4C, 8C, and 16C. Accordingly, E[0] transfers complementary positive and negative charges to Vp and Vn through a charge transfer capacitor with binary weight 1C, E[1] transfers complementary positive and negative charges to Vp and Vn through a charge transfer capacitor with binary weight 2C, E[2] transfers complementary positive and negative charges to Vp and Vn through a charge transfer capacitor with binary weight 4C, E[3] transfers complementary positive and negative charges to Vp and Vn through a charge transfer capacitor with binary weight 8C, and E[4] transfers complementary positive and negative charges to Vp and Vn through a charge transfer capacitor with binary weight 16C. There is not a charge transfer capacitor with a weight of 32C, but for additional bias, E[5] transfers complementary positive and negative charges to Vp with charge transfer capacitor weights 2C, 4C, 8C, and 16C together, as well as to Vn with charge transfer capacitor weights 2C, 4C, 8C, and 16C respectively, summing to a combined bias charge transfer weight of 30C. As with the MAC UE, the positive Bias UE part 400P is enabled when the SGN bit 416 is positive and the negative Bias UE part 400N is enabled when the SGN bit 416 is negative, and the charge is transferred as a complementary charge to the positive and negative charge transfer line to reduce common mode errors at the ADC.

Figure 5A:
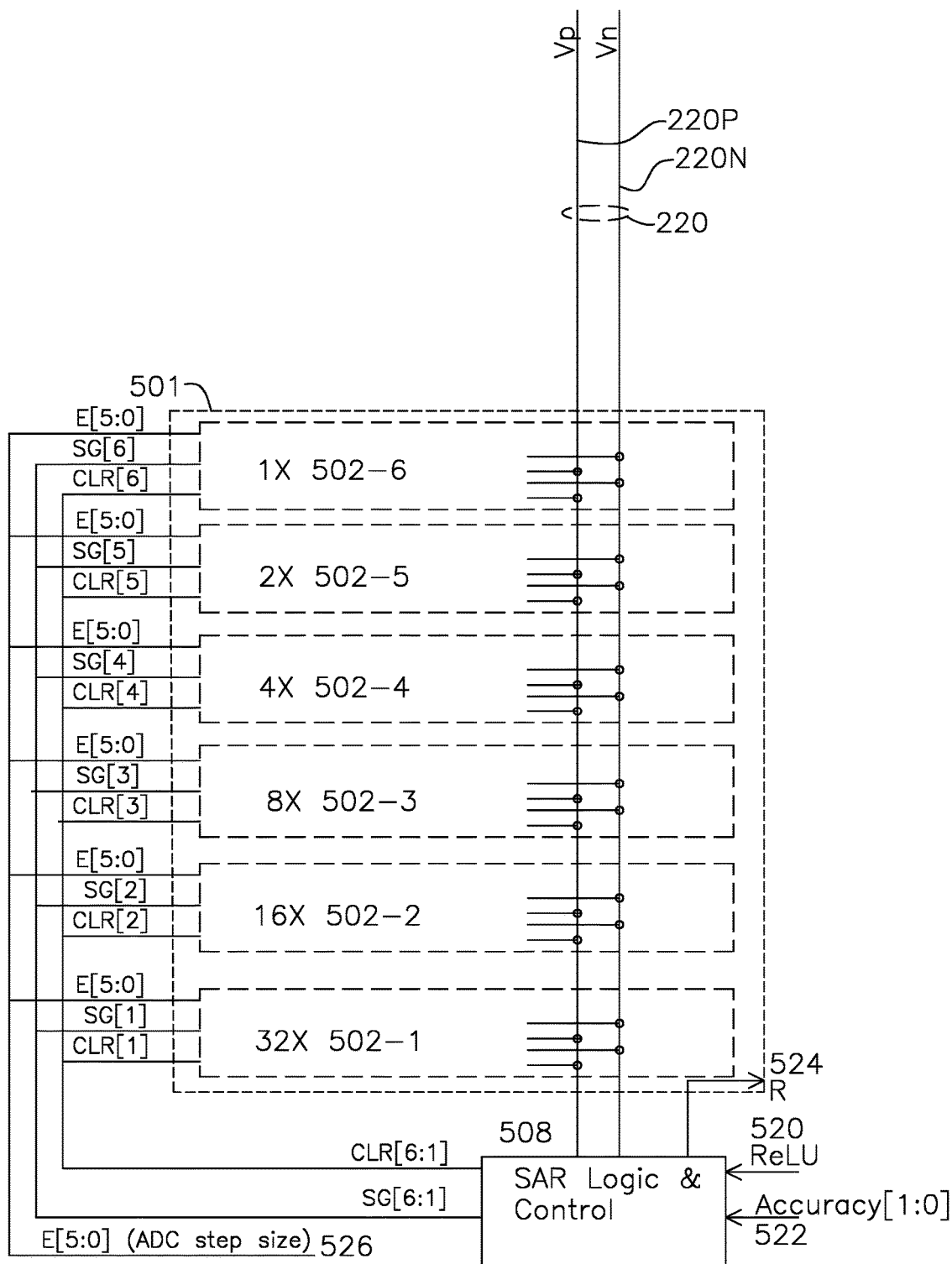
FIG. 5A shows a block diagram of a Successive Approximation ADC controller with a plurality of ADC UEs.

FIG. 5A shows a first example of an ADC 501 coupled to charge transfer bus 220, and which converts the charge transferred to the positive and negative busses to a digital output R 524. The ADC comprises a binary sequence of ADC UEs 501 operating with a Successive Approximation Register (SAR) controller 508. The ADC UE groups 502-1 though 502-6 are a binary sequence of a single ADC UE 502-6, two ADC UEs 502-5, four ADC UEs 502-4, eight ADC UEs 502-3, sixteen ADC UEs 502-2, and thirty two ADC UEs 502-1 for an example 6 bit ADC converter. Each of the ADC UEs are of the same construction as the Bias UEs but arranged in a binary sequence as described above, controlled by the SAR controller 508, and collectively act on input E[5:0] which sets the ADC step size as an independent input which is typically fixed for a particular configuration of ADC UEs. Each ADC UE is connected to a respective SIGN bit SG [6:1] and a respective Clear bit CLR[6:1] which are ADC UE inputs generated by SAR controller 508. The combined ADC UE charge transfer bus 220 comprising positive charge transfer line 220P and negative charge transfer line 220N is connected to SAR controller 508, which also receives input ReLU 520 indicating that a conversion should output a fixed value such as 0 if the input value presented is negative, and optional accuracy input 522 for shortening the number of conversion cycles for additional power savings.

Figure 5B:
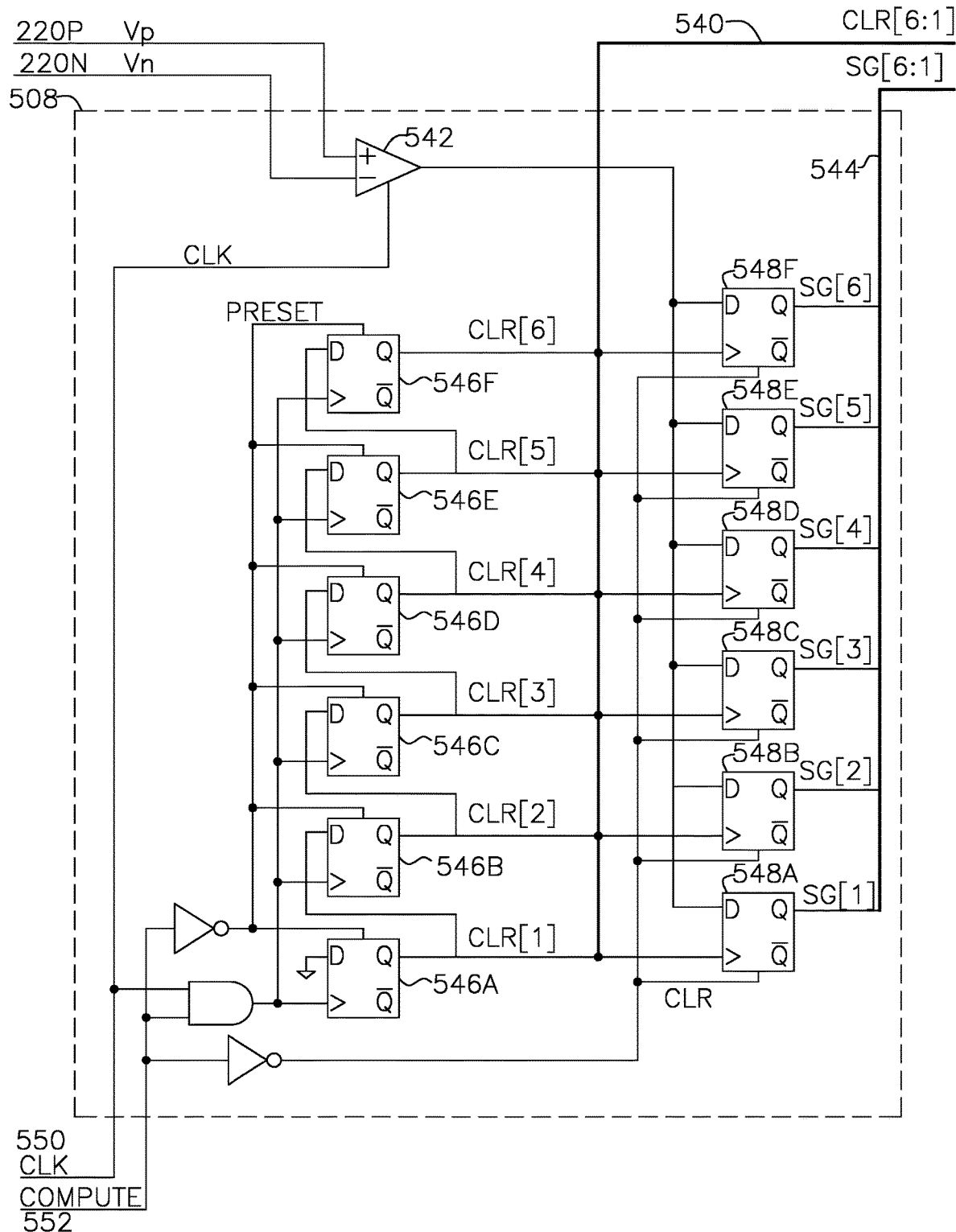
FIG. 5B shows a successive approximation register (SAR) controller for FIG. 5A.

FIG. 5B shows an example Successive Approximation Register (SAR) controller 508 of FIG. 5A. Positive and negative charge transfer lines 220P and 220N, respectively, from FIG. 5A are input to SAR controller 508 and applied to comparator 542. When not asserted, COMPUTE input 552 presets the DFF 546A through 546F, which asserts CLR[1] through CLR[6] delivered to the Bias UEs of FIG. 4A and 4B, with input E[5:0] being a fixed value which establishes the successive approximation step size, which scales the displaced charge onto the differential charge transfer bus 220 with the binary weighted number of Bias UEs 502-6 through 502-1 being switched according to the respective SG and CLR inputs generated by SAR controller 508. When COMPUTE is asserted, the CLK 550 input is distributed to CLR (clear) input of D flip flop (DFF) 546A through 546F, which operates to maintain each UE in a clear state until enabled by a sign bit (SGN) for each corresponding ADC UE. The previous comparator result is presented to all DFF 548A through 548F, however only associated DFF with a low to high transition on a corresponding DFF 546A through 546F generating a clock signal input to DFF 548A to 548C generate an output transition from low to high. Each subsequent clock cycle performs a successive approximation operation, switching the sign input of a subsequent number of UEs from 502-1 to 502-6, each subsequent UE-ADC group which is half the previous number of UEs which were switched.

Figure 5C:
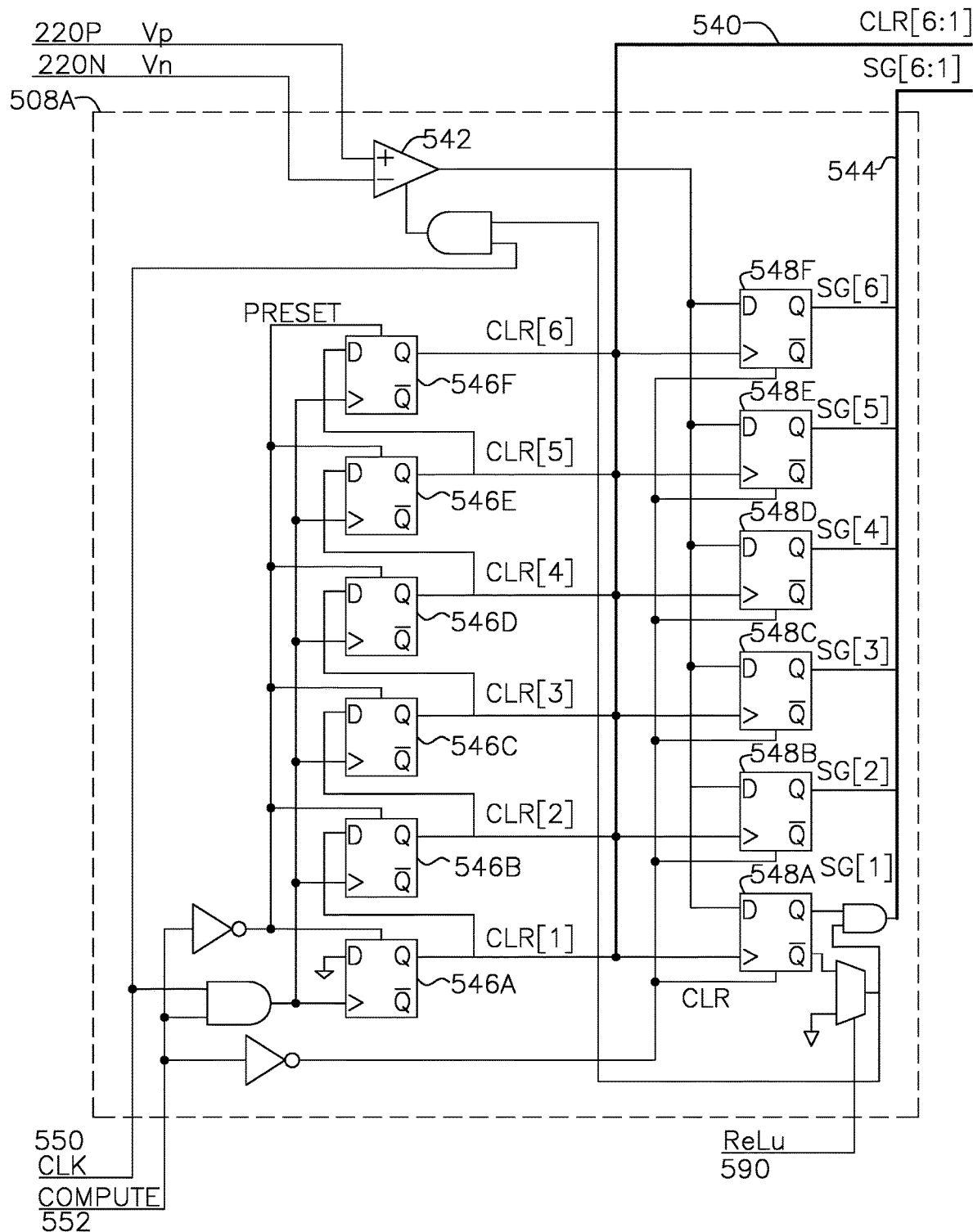
FIG. 5C shows a successive approximation register (SAR) controller which includes ReLU functionality for additional power savings for the control module of FIG. 5A.

FIG. 5C shows an analogous SAR controller, with the addition of ReLU input, which has the effect of stopping the conversion when the input value is negative, as determined by the first conversion of most significant bit SG[1].

Figure 5D:
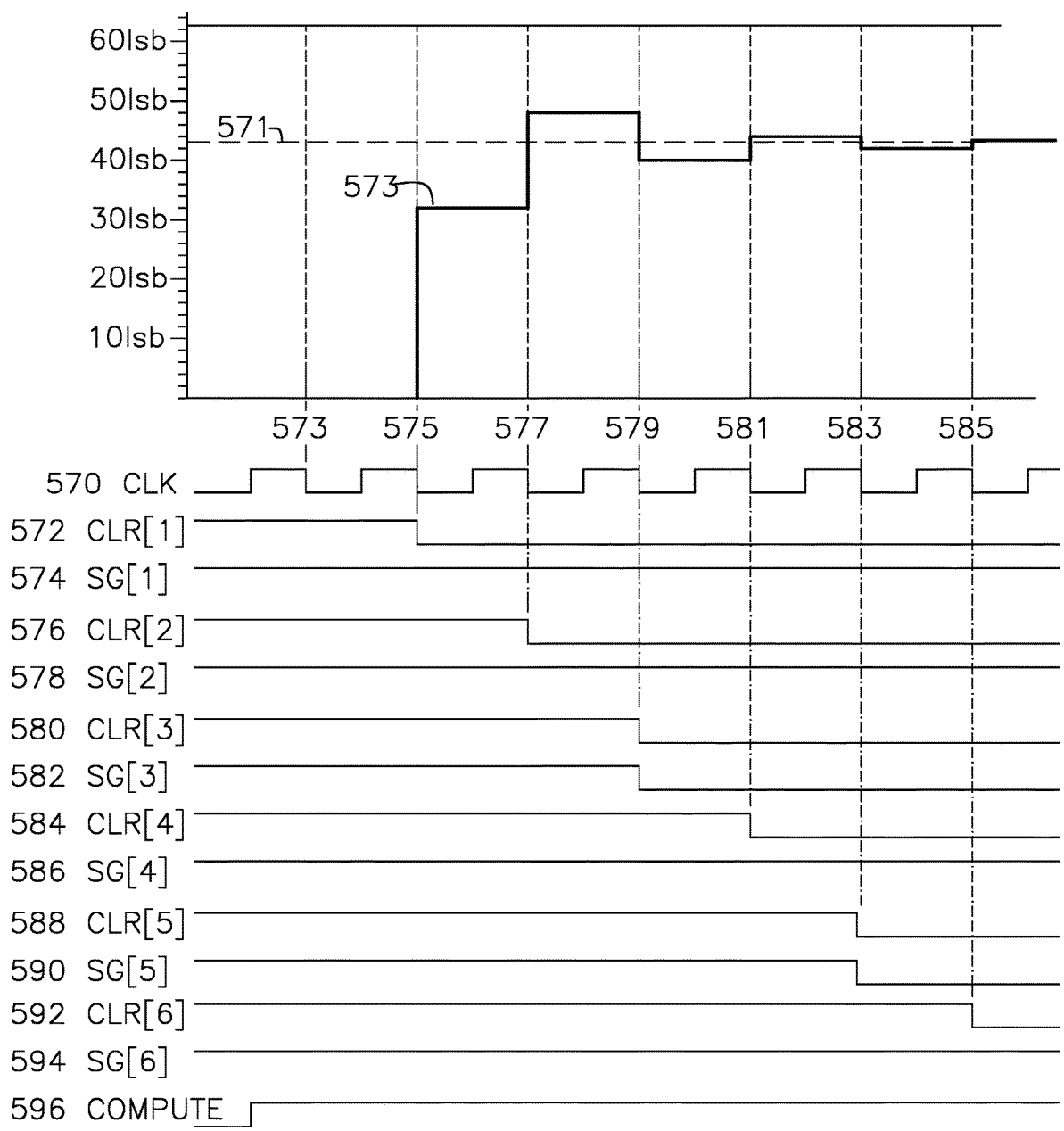
FIG. 5D shows waveform plots for the operation of FIG. 5B.

FIG. 5D shows waveforms for operation of the ADC UE and SAR controller. Compute 596 input enables the SAR controller 508 when high and enables clock 570 input to the internal registers and DFFs. Plot 573 shows the voltage change at the differential charge transfer lines as the groups of ADC UE are switched on and off the charge transfer line 220P and 220N using successive approximation techniques. A charge level 571 from the differential charge transfer lines 220 is input to the SAR controller comparator 542. Generally, the SAR controller operates by adding and subtracting amounts of charge in decreasing binary increments, each of which are half of a previous value. In the case of a range of 64, the first step adds 32, and either subtracts or adds 16 depending on whether a threshold is increased from the input value. Subsequent steps sequentially add or subtract 8, 4, 2, and 1, and the process may stop at any time, with the digitized value being represented as each of the decision steps to add or subtract charge. In the present UE SAR controller, the charge transfer capacitors from each ADC UE group 502-1 to 502-6 of each ADC UE are added or removed in a successive manner, resulting in the groupings of 32 ADC UE 502-1, 16 ADC UE 502-2, 8 ADC UE 502-3, 4 ADC UE 502-4, 2 ADC UE 502-5, and 1 ADC UE 502-6. In plot 573, the initial charge is 0, and so first clock edge at time 573 results in the application of weight 32 of 506-2 to the charge bus (corresponding to SG[1]=1. The groups of ADC UE 502-1 to 502-6 may transfer positive or negative charge with the corresponding SG (sign) input, which is controlled by the SAR controller 508. The next decision is made at time 575, and since the value at time 575 is below input 571, an additional 8 ADC UEs charge from 502-3 are added. Waveform 573 value now exceeds input 571, so 4 a subtractive charge from ADC UEs is applied at time 577, and each subsequent clock 579, 581, 583, and 585 results in the addition or subtraction of charge as shown, resulting in the output value [1 1 0 1 0 1] corresponding to SG[1:6].

Figure 6A:
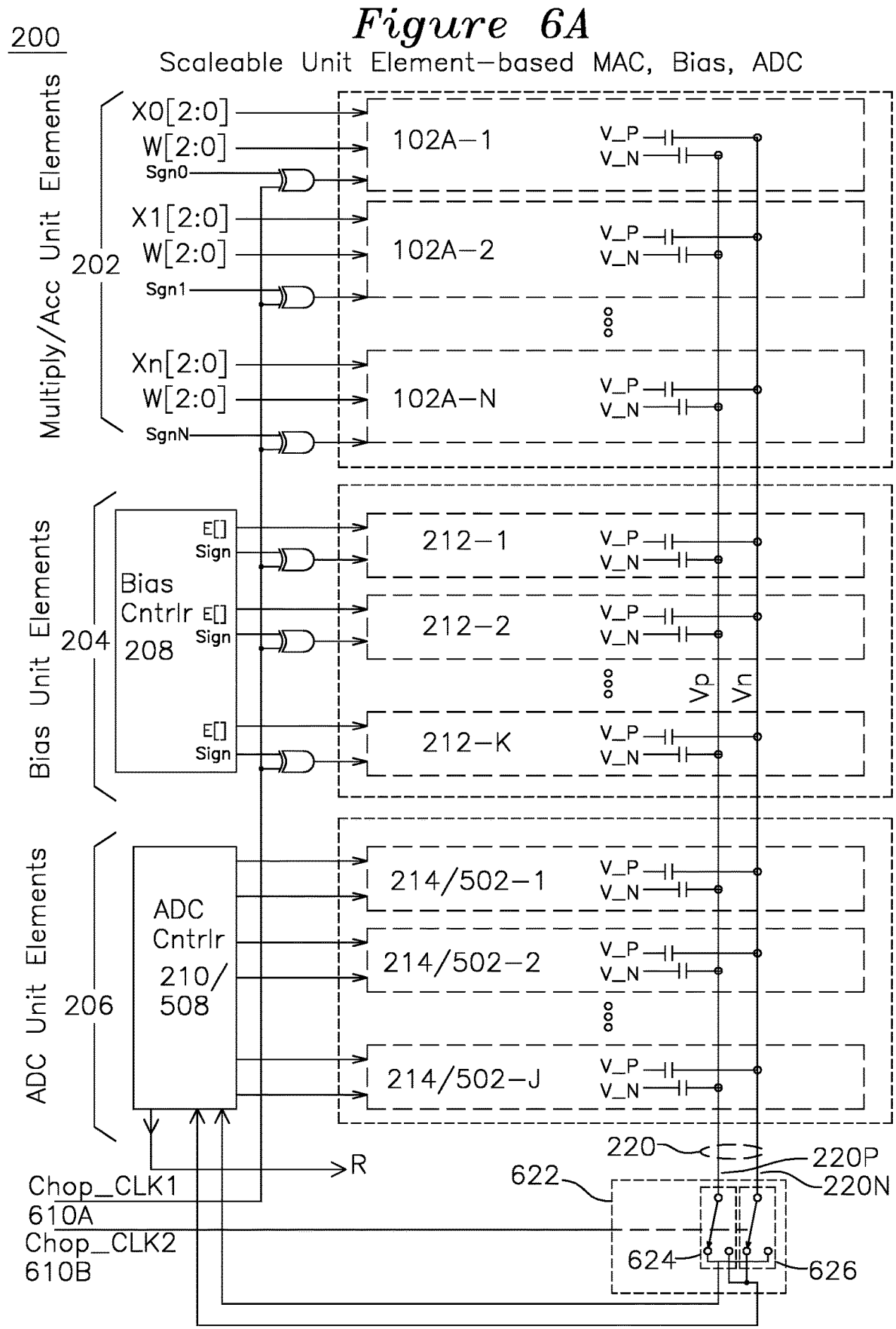
FIG. 6A shows a MAC of FIG. 2 with a chop clock of a first embodiment reducing gain errors and offsets applied to the UE sign inputs and a second embodiment using a commutating polarity reversal before the ADC UE for cancelling offsets.

FIG. 6A shows two possible variations of FIG. 2, a first embodiment using Chop_CLK1 610A, and a second embodiment using Chop_CLK2 610B with commutating switch 622. In the first variation, Chop_CLK1 610A is applied, and commutator 622 remains in a fixed position which does not reverse the differential charge transfer lines applied to SAR controller 210. In the second variation, Chop_CLK1 610A is not used, the sign bits are applied directly to the associated MAC UE 102A and Bias UE 212 without exclusive OR gates, and Chop_CLK2 610B is applied to commutating switch 622 to reverse the polarity of the differential charge transfer lines applied to ADC controller 210. In a preferred embodiment of the invention, the two variations of the invention are practiced in different circumstances, such that the first variation may reduce gain errors and offsets of the MAC UE, Bias UE, and ADC UE offsets, and the second variation may reduce only ADC offsets but with lower incurred power cost. ADC controller 508 and ADC UEs 502 perform analogously to 210 and 212, respectively, which were previously described.

In the first variation, the Chop_CLK1 610A is exclusive ORed with the sign bit applied to the MAC UE 102 and Bias UE 212 (each of which has a positive UE and negative UE component as described) to cancel systematic offsets and gain mismatches between each positive and negative UE component of the MAC UE and Bias UE. An additional advantage is the reduction of influence of 1/f noise (also known as flicker noise or fractional Brownian noise). An exclusive OR operation generates a 1 output for inputs [1 0] or [0 1], and generates a 0 output for inputs [0 0] and [1 1]. FIG. 6A shows the two variations for use of a chop clock. Well-known 1/f noise has a spectral power which is inversely proportional to frequency, and is of correspondingly greater magnitude at low frequencies than high frequencies.

In the first variation using Chop_CLK1 610A, the technique reduces offset voltages and gain errors between the positive UE and negative UE of the MAC UE and Bias UE, as well as ADC offsets by performing two separate A/D conversions on each Chop_CLK1 610A clock cycle comprising a first half and second half. A first MAC and Bias charge is transferred to the differential charge transfer bus 220 during a first half of the Chop_CLK1 610A and then repeated with the positive and negative UE components reversed during the second half of Chop_CLK1 610A by using the sign bit to switch the operations of the positive and negative components of the MAC UE and Bias UE while the ADC offsets remain in fixed polarity and cancel when the result of the second half of Chop_CLK1 is subtracted from the result of the first half of Chop_CLK1. The second result is then subtracted from the first result to provide the corrected result with reduced gain and offset errors. In the example of the invention shown in FIG. 6A, Chop_CLK1 610A is preferably double the ADC conversion rate, and Chop_CLK1 is exclusive ORed with the Sign bit of each of the positive and negative components of AMAC UE 202, and the positive and negative components of Bias UE 204, which results in the reversal of function of the positive and negative UEs applying charge to the analog charge bus 220 at twice the rate of the Chop_CLK1 610A, which reduces the effect of minor gain differences between the positive UE and negative UE for each individual UE, cancels offset differences, and reduces 1/f noise.

In the second variation of the invention of FIG. 6A, Chop_CLK1 is set to 1, and the sign bits are therefore passed through the XOR and applied directly to the MAC UEs 102 and Bias UEs 212, as was described in FIG. 2. In this second variation, Chop_CLK2 610B is applied to commutating switch 622, which results in the reversal of the differential charge transfer bus 220 to the ADC controller 508 (functioning as 210 of FIG. 2) where the differential charge transfer bus 220 is shown coupled to the input of comparator 542 of FIG. 5B through commutating switch 622, which reverses the applied polarity of the differential charge transfer bus 220 with each level change of Chop_CLK2 610B. In the case where the comparator 542 has a large offset voltage, the second variation may be used to cancel that offset by performing a first conversion (Vadc+Vos) followed by a second conversion (-Vadc+Vos) and subtracting the second conversion from the first and dividing by 2 to generate Vadc with the offsets cancelled. The mode of operation is typically lower energy than the first variation, but does not compensate for gain and offset errors of the MAC and Bias UEs.

In another example of the invention, FIG. 6B shows the architecture of FIG. 2 as was previously described, with the addition of input registers 602, such that a series of activation matrix X and signed kernel matrix W can be applied with E bias values and converted to an output R value for each computation, thereby providing additional optional functionality for selecting a set of weights and sign for a column multiply-accumulate with varying X input and fixed weight and sign kernel values.

In a first arrangement of X input and W kernel coefficients, a row of $[x_1 \ldots x_n]$ is multiplied and summed element by element with $[w_{11} \ldots W_{n1}]$ from equation 1 presented earlier by a single MAC UE, resulting in the gain of the single MAC UE effecting the influence of that MAC UE contribution to charge placed on the differential charge transfer bus. An advantages of the architecture of FIG. 6B is that the registers may provide the ability to assign the individual W and X pairs of values in a round robin manner across multiple MAC UEs. In the case where the AMAC UE are perfectly matched to each other, it makes no difference which AMAC handles which W and X values, however it may be the case that one AMAC has slightly greater or lesser charge displacement, such as where the charge transfer capacitors are of differing value. A difficulty results in that if one AMAC UE is handling a long series of ML inferences in a single layer but has a reduced or increased gain compared to another AMAC UE processing W and X for a different layer, the reduced or increased gain will undesirably affect all values being processed and reduce or increase the inference result for a particular layer. To reduce the likelihood of these types of gain errors, is desired to average out those non-uniformities such as by a round-robin method of rotating the W and X pairs through the UEs such that different layer W and X pairs are applied to an AMAC UE. For example, in a first method which does not provide UE balancing, the operations assigned to UE 1 to UE N may be:

AMAC UE1: k1*(W11*X11+W12*X12+W13*X13+ . . . ) for layer 1

AMAC UE2: k2*(W21*X21+W22*X22+W23*X23+ . . . ) for layer 2

AMAC UE3: k3*(W31*X31+W32*X32+W33*X33+ . . . ) for layer 3 where W and X are the respective weight and inputs, respectively, and k is approximately 1, but represents the gain variation of a particular AMAC UE. The advantage of such scrambling, or round robin, or other assignment of X and W pairs is to distribute AMAC gain errors k1, k2, k3 across the entire inference result, thereby reducing the influence of MAC UE gain error contributions from one or more MAC UEs with differing gain.

The values placed into the register may take advantage of the commutative property of the AMAC with shared charge transfer bus, and scramble the layer coefficient W and X values, such that:

AMAC UE1: k1*(W11*X11+W21+X21+W31*X31+ . . . )

AMAC UE2: k2*(W12*X12+W22+X22+W32*X32+ . . . )

AMAC UE3: k3*(W13*X13+W23+X23+W33*X33+ . . . ) or any arbitrary rearrangement of W and X such as by assignment of corresponding W and X to the input registers 602 of FIG. 6B in a non-sequential manner, mixing coefficients sets from different inference layers.

Figure 7A:
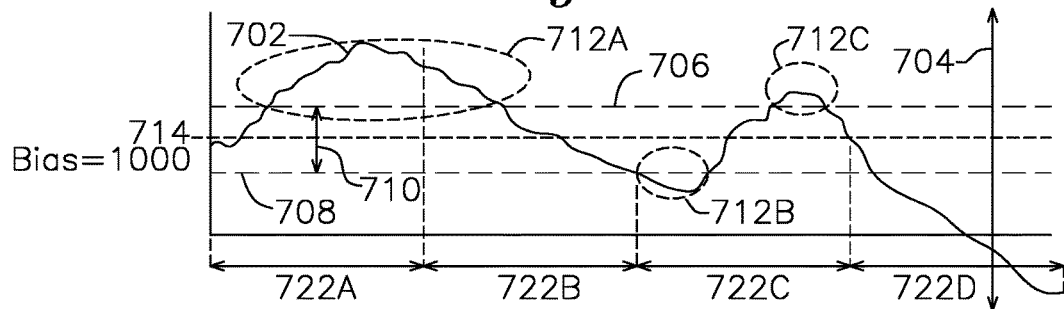
FIG. 7A shows a plot for an inference over time with a bias 714.
Figures 1, 7B:
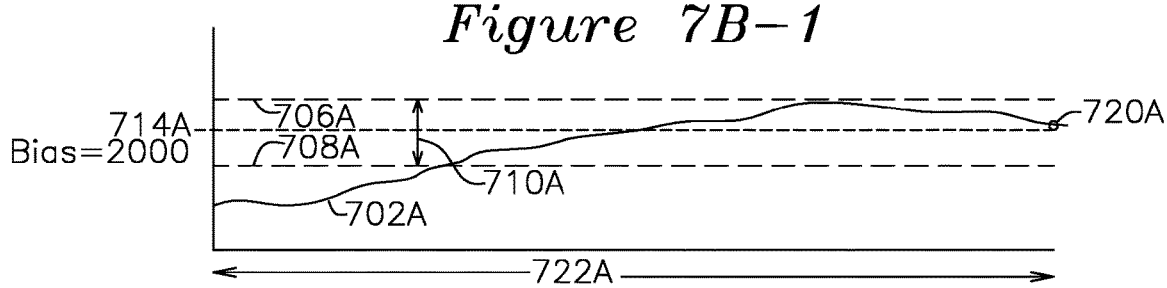
Figures 2, 7B:
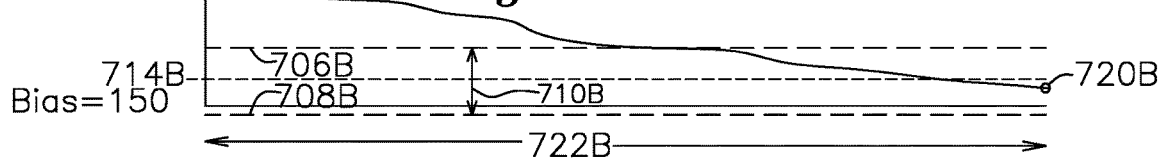
Figures 3, 7B:
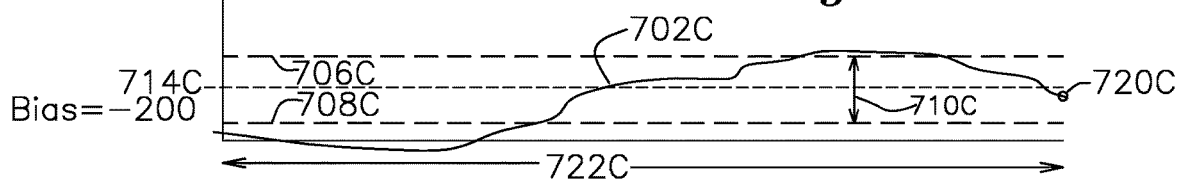
Figures 4, 7B:
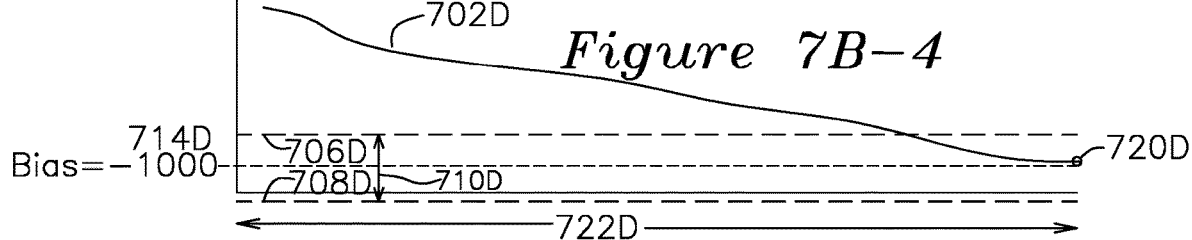
Figure 7C:
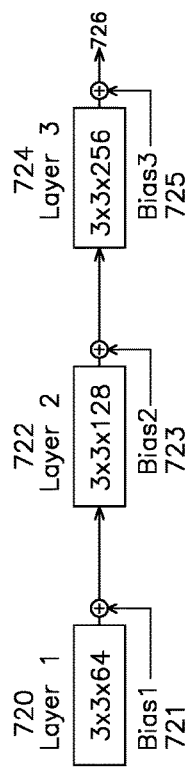
FIG. 7C shows a block diagram for a three layer machine learning digital architecture.
Figure 7D:
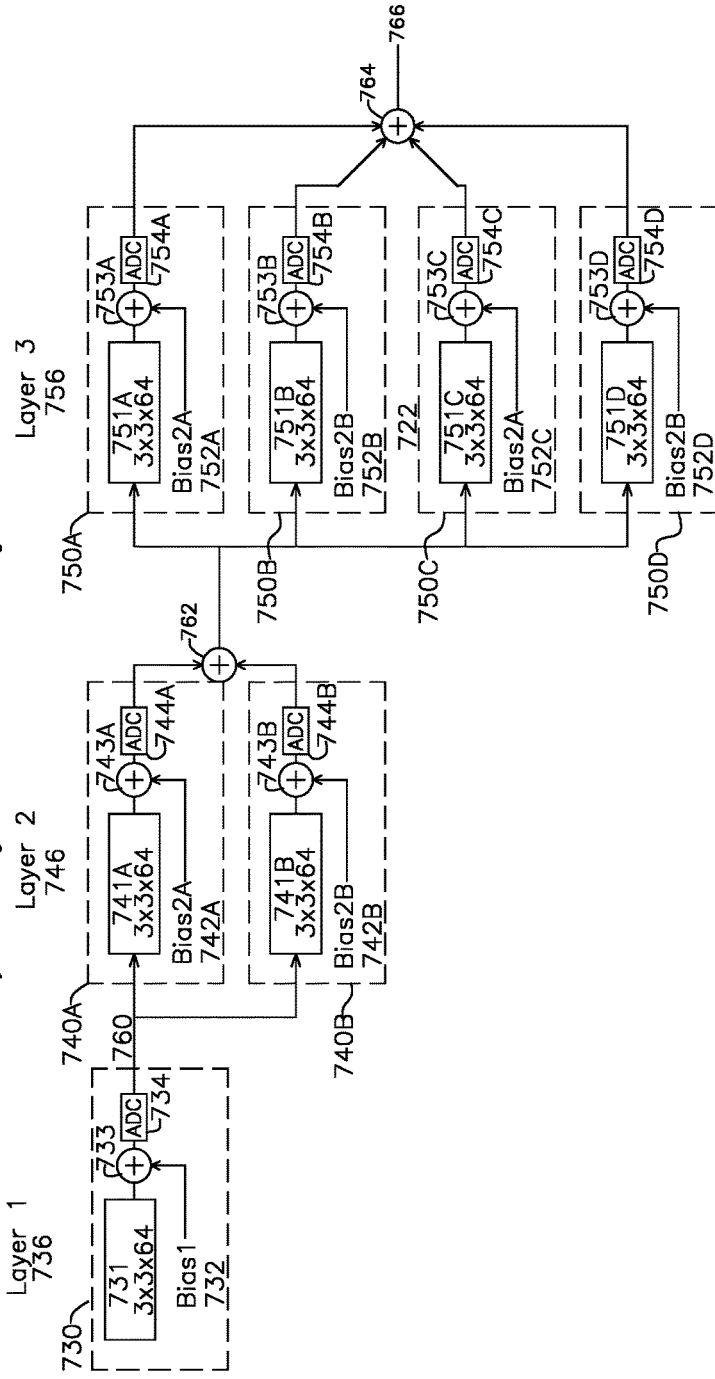
FIGS. 7D shows a block diagram for a modular analog implementation of FIG. 7C over three layers using fixed size 3x3x64 AMACs.

FIG. 7A shows a plot 702 of inference result over time representing the accumulated result of X inputs multiplied by W coefficients with an applied bias 714 equal to 1000, typically determined during training. The accumulated result of the plot have a dynamic range 704, which may be within the range of a digital processor performing these machine learning operations after training, such as the three layer example shown in the digital machine learning architecture of FIG. 7C, with first layer 720, second layer 722, and third layer 724. The first layer 720 utilizes a 3x3x64 MAC, the second layer 722 is a 3x3x128 MAC, and the third layer is a 3x3x256 MAC, each level having its own bias input 721, 723, and 725, respectively. Two problems arise in implementing the architecture of FIG. 7C as an analog ML architecture. A first problem of an analog system with a limited dynamic range is shown as 710 with lower quantization limit 708 and upper quantization limit 706, the accumulated result 702 may extend beyond the upper limit in region 712A and 712C, or below the lower limit 708 shown in 712B. Typically, during training, a bias level 714 such as 1000 is added to the accumulated result to center the accumulated result 702 in the range 710, and a digital system with a large dynamic range is able to accommodate that range. A second problem of an analog system is that the basic architecture may use a reconfigurable series of modular and reconfigurable, but fixed dimension, AMACs, shown in the present example as 3x3x64. In the present invention, the 3x3x128 level 2 ML processor 722 can be accomplished 746 using two 3x3x64 AMACs 740A and 740B, and the 3x3x256 ML processor 724 can be accomplished 756 using four 3x3x64 AMACs 740A, 740B, 740C, and 740D. The problem of maintaining the accumulated inference value in the dynamic range for each AMAC can then be addressed by providing each separate AMAC with its own separate Bias, shown as 742A and 742B for layer 2 746 AMACs 740A and 740B, and 752A, 752B, 752C, and 752D for layer 3 756. The bias levels for each AMAC are determined during training by examining the signal range, optionally incorporating the ReLu function, and the training determines a bias which places the final accumulated result R in the operating ADC range limit of the associated ADC.

The plots of FIGS. 7B-1, 7B-2, 7B-3, 7B-4 show the use of separate bias for the layer 3 756 AMACs 750A, 750B, 750C, and 750D which operate in time segments 722A, 722B, 722C, and 722D of FIG. 7A, respectively. Each plot 702A, 702B, 702C, 702D represents the accumulated multiply-accumulate value over time for each separate AMAC handling the processing of FIG. 7A. In this example, each AMAC has a different bias level to maintain the signal in the ADC dynamic range at the end of the accumulation for each particular AMAC, shown as Bias2A=2000 714A for AMAC 750A, Bias2B=150 714B for bias applied to AMAC 750B, Bias2C=-200 714C for bias applied to AMAC 750C, and Bias2D=-1000 714D for bias applied to 750D. In this manner, each AMAC is operating in its own sufficient dynamic range (710A, 710B, 710C, and 710D) at the end of each inference segment, and the digitized output results (744A and 744B of layer 2 and 754A, 754B, 754C, and 754D of layer 3) may be summed (762 for layer 2, 764 for layer 3) for each AMAC stage to generate respective final digital outputs 720A, 720B, 720C, and 720D.

The present multiplier architecture has certain advantages. In the prior art, multi-stage multipliers are synchronous devices with a running clock, which requires energy for displacement currents associated with each clock edge transition. In the various examples of the invention, the multiplication is operative asynchronously, and without any clocks, the multiplication value changing and being updated asynchronously when a multiplicand input changes value. Additionally, the present invention has the advantage of scalability, in that additional MAC UEs, Bias UEs, and ADC UEs may be added or disabled together on the common charge transfer bus as shown in the figures, such that each additional unit element may be flexibly added or isolated from the charge transfer bus, and the accumulation of each multiplication result occurs on a respective charge transfer bus. In an example use case, the invention may be used where the W kernel values are static weight coefficients and the X multiplicands are dynamic for dot product computations in machine learning applications.

The proceeding has been a description of the various embodiments of the invention, but does not limit the invention to only the example embodiments shown. For example, the logic gates are shown as NAND such as 320P of FIG. 3B generating a "positive output" 322PN and complement or negative output 324PP. A NAND gate is known to produce a logic 0 output when logic inputs are all 1, and a logic 1 at other times, and inverter 322N is known to invert a logic 1 into a logic 0 and visa versa. The examples showing NAND gates and inverters could also be accomplished with AND gates and inverters, with the positive and negative charge transfer bus connections reversed, as an obvious variant to perform the same functions, without limitation to the generation of complementary outputs from each NAND or AND gate, the complementary outputs which may variously be referred to as an "output" and "complement output", or "positive output" and "negative output" in the spirit of the invention, each providing differential transfer of charge from the binary weighted charge transfer capacitors to an associated positive or negative charge transfer line of the shared differential charge transfer bus. An "Exclusive OR" gate is known to produce 0 output when the inputs are the same logic level and a 1 output when the inputs are a different logic level, and may also be practiced as an "Exclusive NOR" gate which operates in the same manner but with an inverted output. Accordingly, recitations of NAND logic in the claims include the obvious gate variants, including AND gates, OR gates, NOR gates, and combinations of logic elements which perform the functions as described. Similarly, the polarity of the sign bit given as 0 for positive and 1 for negative for clarity in explanations, and it is understood that this is only one convention for understanding the examples of the invention. It will be appreciated that deviations and modifications can be made without departing from the scope of the invention, which is defined by appended claims. Various approximations may be used in the specification of the patent application, the approximations are understood to refer to ranges from a nominal value. A value which is "substantially" a nominal value is understood to be in the range of a factor of 1/2 to 2 times the nominal value. A value which is "on the order of" a nominal value or "an order of magnitude" of a nominal value is understood to be in the range 1/10th to 10x the nominal value.

We claim:

1. A Bias Unit Element (UE) receiving an E digital input with an enable bit and generating charge coupled to a differential charge transfer bus comprising a positive charge transfer line and a negative charge transfer line, the Bias UE comprising:

a plurality of logic gates, each logic gate having an input coupled to an E digital input bit and the enable bit and generating a positive output and a negative output;

the positive output coupled through a binary weighted charge transfer capacitor to the positive charge transfer line, the negative output coupled through a binary weighted charge transfer capacitor to the negative charge transfer line;

each binary weighted charge transfer capacitor having an associated binary weight, the binary weight for each charge transfer capacitor including at least relative weights of 1, 2, 4, 8, and 16.

2. The Bias UE of claim 1 where each logic gate comprises a NAND gate having an input coupled to an E digital bit, an input coupled to the enable bit, an output coupled to the negative output and also to an inverter generating the positive output.

3. The Bias UE of claim 1 where an E[0] bit is coupled to the input of the logic gate and the positive output is coupled through a binary weighted charge transfer capacitor with relative weight 1 to the negative charge transfer line, and the negative output is coupled through a binary weighted charge transfer capacitor with relative weight 1 to the positive charge transfer line.

4. The Bias UE of claim 1 where an E[1] bit is coupled to the input of the logic gate and the positive output is coupled through a binary weighted charge transfer capacitor with relative weight 2 to the negative charge transfer line, and the negative output is coupled through a binary weighted charge transfer capacitor with relative weight 2 to the positive charge transfer line.

5. The Bias UE of claim 1 where an E[2] bit is coupled to the input of the logic gate and the positive output is coupled through a binary weighted charge transfer capacitor with relative weight 4 to the negative charge transfer line, and the negative output is coupled through a binary weighted charge transfer capacitor with relative weight 4 to the positive charge transfer line.

6. The Bias UE of claim 1 where an E[3] bit is coupled to the input of the logic gate and the positive output is coupled through a binary weighted charge transfer capacitor with relative weight 8 to the negative charge transfer line, and the negative output is coupled through a binary weighted charge transfer capacitor with relative weight 8 to the positive charge transfer line.

7. The Bias UE of claim 1 where an E[4] bit is coupled to the input of the logic gate and the positive output is coupled through a binary weighted charge transfer capacitor with relative weight 16 to the negative charge transfer line, and the negative output is coupled through a binary weighted charge transfer capacitor with relative weight 16 to the positive charge transfer line.

8. The Bias UE of claim 1 where an E[5] bit is coupled to the input of the logic gate and the positive output is coupled through binary weighted charge transfer capacitors with weights 2, 4, 8, and 16 to the negative charge transfer line; and the negative output is coupled through binary weighted charge transfer capacitors with weights 2, 4, 8, and 16 to the positive charge transfer line.

9. A Bias Unit Element (UE) receiving a digital E input, a sign bit, and transferring a bias value to a differential charge transfer bus, the Bias UE comprising:
a differential charge transfer bus comprising a positive charge transfer line and a negative charge transfer line;
a positive bias UE enabled when the sign bit is positive, the positive bias UE comprising a plurality of logic gates generating a positive output and a negative output from each E input bit, each positive output coupled through a binary weighted charge transfer capacitor to the negative charge transfer line, and each negative output coupled through a binary weighted charge transfer capacitor to the positive charge transfer line;
a negative bias UE enabled when the sign bit is negative, the negative bias UE comprising a plurality of logic gates generating a positive output and a negative output from each E input bit, each positive output coupled through a binary weighted charge transfer capacitor to the positive charge transfer line, and each negative output coupled through a binary weighted charge transfer capacitor to the negative charge transfer line.

10. The Bias UE of claim 9 where the positive bias UE and negative bias UE each have binary weighted charge transfer capacitors with relative weights 1, 2, 4, 8, and 16.

11. The Bias UE of claim 9 where the plurality of logic gates comprises a NAND gate having an input coupled to a respective E digital input bit and input coupled to the sign bit either with or without an inversion, the NAND gate output coupled to the positive charge transfer line through the binary weighted charge transfer capacitor, the NAND gate output coupled to an inverter coupled to the negative charge transfer line though the binary weighted charge transfer capacitor to the negative charge transfer line.

12. The Bias UE of claim 9 where an active E[0] bit of the input causes charge to be added or subtracted from at least one of the positive charge transfer line or the negative charge transfer line through a charge transfer capacitor having a relative weight of 1.

13. The Bias UE of claim 9 where an active E[1] bit of the input causes charge to be added or subtracted from at least one of the positive charge transfer line or the negative charge transfer line through a charge transfer capacitor having a relative weight of 2.

14. The Bias UE of claim 9 where an active E[2] bit of the input causes charge to be added or subtracted from at least one of the positive charge transfer line or the negative charge transfer line through a charge transfer capacitor having a relative weight of 4.

15. The Bias UE of claim 9 where an active E[3] bit of the input causes charge to be added or subtracted from at least one of the positive charge transfer line or the negative charge transfer line through a charge transfer capacitor having a relative weight of 8.

16. The Bias UE of claim 9 where an active E[4] bit of the input causes charge to be added or subtracted from at least one of the positive charge transfer line or the negative charge transfer line through a charge transfer capacitor having a relative weight of 16.

17. The Bias UE of claim 9 where an active E[5] bit of the input causes charge to be added or subtracted from at least one of the positive charge transfer line or the negative charge transfer line through a charge transfer capacitor having a relative weight of 2, 4, 8, and 16.

18. The Bias UE of claim 9 where the binary weighted charge transfer capacitors have relative weights of 1, 2, 4, 8, and 16.

19. The Bias UE of claim 18 where the positive UE said plurality of logic gates are configured to output a 1 value to the negative charge transfer line when a sign bit is 1 or when the clear input is 1.

20. The Bias UE of claim 18 where the negative UE said plurality of logic gates are configured to output a 1 value to the positive charge transfer line when a sign bit is 0 or when the clear input is 1.

21. A Bias UE receiving a digital bias value E, a clear input, and a sign input, the Bias UE generating a bias charge coupled to a differential charge transfer bus comprising a positive charge transfer line and a negative charge transfer line in response to the digital bias value E, the Bias UE comprising:
a positive Bias UE enabled when the sign bit is positive;
a negative Bias UE enabled when the sign bit is negative;
the positive bias UE comprising a plurality of logic gates, each logic gate coupled to one of the digital bias E bits, the sign bit, and the clear bit, each logic gate generating a positive output and a negative output which is the complement of the positive output, each positive output of each of the plurality of logic gates coupled through a binary weighted charge transfer capacitor to the negative charge transfer line and each negative output of each of the plurality of logic gates coupled through a binary weighted charge transfer capacitor to the positive charge transfer line;

the negative bias UE comprising a plurality of logic gates, each logic gate coupled to one of the digital bias E bits, the sign bit, and the clear bit, each logic gate generating a positive output and a negative output which is the complement of the positive output, each positive output of each of the plurality of logic gates coupled through a binary weighted charge transfer capacitor to the positive charge transfer line and the negative output of each of the plurality of logic gates coupled through a binary weighted charge transfer capacitor to the negative charge transfer line.

* * * * *